(12) United States Patent
Waters et al.

(10) Patent No.: US 8,614,110 B1
(45) Date of Patent: Dec. 24, 2013

(54) METHOD FOR FABRICATING A DUAL-CRYSTALLINE SILICON SUSPENSION SYSTEM USING PRE-FABRICATED CAVITIES

(75) Inventors: Richard Waters, San Diego, CA (US); Steve Fanelli, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 514 days.

(21) Appl. No.: 12/840,950

(22) Filed: Jul. 21, 2010

Related U.S. Application Data

(63) Continuation-in-part of application No. 11/780,420, filed on Jul. 19, 2007, now Pat. No. 7,767,483.

(60) Provisional application No. 60/835,965, filed on Jul. 25, 2006.

(51) Int. Cl.
*H01L 21/00* (2006.01)

(52) U.S. Cl.
USPC ........................ 438/50; 438/51; 257/E23.002

(58) Field of Classification Search
USPC .................. 438/51, 52, 53, 50; 257/415, 417, 257/E23.002
See application file for complete search history.

(56) References Cited

U.S. PATENT DOCUMENTS

| | | | |
|---|---|---|---|
| 6,472,962 B1 * | 10/2002 | Guo et al. ...................... | 333/262 |
| 2002/0190319 A1 * | 12/2002 | Borenstein .................... | 257/347 |
| 2004/0147056 A1 * | 7/2004 | McKinnell et al. ............. | 438/52 |

* cited by examiner

*Primary Examiner* — Amar Movva
(74) *Attorney, Agent, or Firm* — Ryan J. Friedl; Kyle Eppele

(57) ABSTRACT

A method is provided to create a proof mass supported by a dual-suspension system for Micro-Electro-Mechanical Systems (MEMS) using crystalline silicon. The pre-fabricated cavity method decreases the subsequent processing required to create the final mechanical structure including the proof mass and dual-suspension system. During processing, the proof mass may be connected to a support structure via tethered regions, which are removed subsequent to proof mass formation.

13 Claims, 8 Drawing Sheets

METHOD FOR FABRICATING A DUAL-CRYSTALLINE SILICON SUSPENSION SYSTEM USING PRE-FABRICATED CAVITIES

CROSS-REFERENCE TO RELATED APPLICATIONS

This application is a continuation-in-part of U.S. patent application Ser. No. 11/780,420, filed on Jul. 19, 2007 now U.S. Pat. No. 7,767,483, entitled "Dual-Suspension System for MEMS-based Devices and Method for Fabricating Same", such application claiming the benefit of U.S. Provisional Patent Application Ser. No. 60/835,965, filed on Jul. 25, 2006, entitled "Dual-Suspension System for MEMS-based Devices", the content of both fully incorporated by reference herein.

FEDERALLY-SPONSORED RESEARCH AND DEVELOPMENT

The Method for Fabricating a Dual-Crystalline Silicon Suspension System Using Pre-Fabricated Cavities is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email ssc_pac_T2@navy.mil. Reference Navy Case Number 100513.

BACKGROUND

MEMS-based devices may use deposited polycrystalline or amorphous materials to form compliant regions. The compliant regions may be defined using a combination of photolithographic techniques along with selective dry or wet etching to pattern various compliant spring geometries in order to meet the particular application requirements. These techniques may be used to define either a single set of springs attached to a portion of a proof mass surface or dual sets of springs attached to top and bottom regions of a proof mass. However, the performance of the formed spring-mass system is impacted by the exact deposition thickness of the material, deposition thickness uniformity across a sensor design, stress of the deposited material, and surface roughness of the deposited material. Additionally, amorphous and polycrystalline springs tend to suffer from mechanical creep over time, thus changing the characteristics under which they act under an applied external force.

Alternatively, other MEMS designs may utilize a timed wet or dry etch of bulk crystalline silicon to define a thin complaint single crystal suspension system. The etching can occur from the front, back or front and back of a single crystal wafer to form the desired compliant region. The drawback to these techniques is that because they rely on a timed etched, the thickness of the resultant compliant region can be impacted and therefore the spring constant is not as predicted or designed. In addition, the etches used to define the compliant regions are not ideal and can lead to surface roughness, thereby impacting the quality of the compliant region.

DETAILED DESCRIPTION OF SOME EMBODIMENTS

Figure 1A:
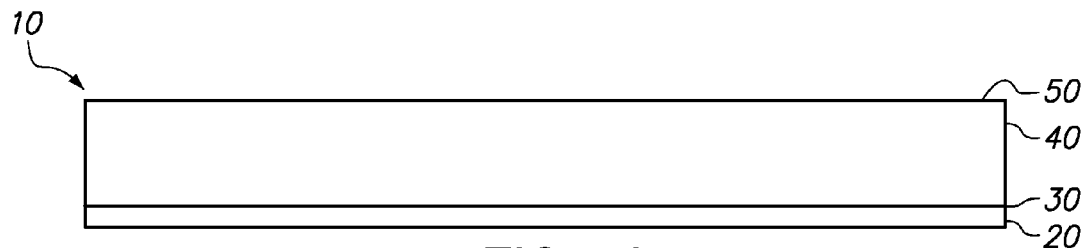
FIGS. 1A-1E show cross-section views of an embodiment of a first silicon on insulator (SOI) wafer processed in accordance with the Method for Fabricating a Dual-Crystalline Silicon Suspension System Using Pre-Fabricated Cavities.

FIGS. 1A-1E show cross-section views of an embodiment of a first silicon on insulator (SOI) wafer 10 processed in accordance with the Method for Fabricating a Dual-Crystalline Silicon Suspension System Using Pre-Fabricated Cavities. Wafer 10 includes a first SOI wafer device layer 20, a first SOI wafer buried oxide (BOX) layer 30 coupled to first SOI wafer device layer 20, and a first SOI wafer handle layer 40 coupled to first SOI wafer BOX layer 30.

First SOI wafer device layer 20 may comprise mono-crystalline silicon. In some embodiments, device layer 20 and handle layer 40 may comprise different crystallographic orientations. In some embodiments, an oxide layer 50 is coupled to first SOI wafer handle layer 40. As an example, oxide layer 50 may be thermally grown or deposited. The thicknesses of device layer 20, BOX layer 30, and handle layer 40 may vary depending upon the particular application. However, the thickness of BOX layer 30, and oxide layer 50 (if used), should be kept to a minimal value to avoid adding additional stress to device layer 20. In some embodiments, the thickness of device layer 20 may be greater than the desired thickness of the springs (springs shown in FIGS. 5 and 6), which may have a thickness of, for example, 15 μm or 30 μm. In such embodiments having a thicker device layer, device layer 20 may then be polished back to a thickness corresponding to a desired spring thickness prior to spring fabrication.

In some embodiments, first SOI wafer 10 is pre-processed and is provided as shown. In other embodiments, wafer 10 is created by starting with two bulk silicon wafers. The first wafer provides the device layer 20 having a well-defined silicon dioxide layer 30 grown on the surface thereof. The second wafer (handle layer 40) may be fusion bonded to the first wafer. One of the wafers may then be mechanically ground down, followed by chemical-mechanical polishing (CMP), to remove any damage from the grinding process and to create a smooth and well-polished surface.

First SOI wafer handle layer 40 has at least one cavity 62 extending therethrough and at least partially defining a proof mass. In other embodiments, wafer handle layer 40 may include multiple cavities extending therethrough and at least partially defining a proof mass (see for example, FIGS. 3A and 3B). In some embodiments, the proof mass may include holes 64 therethrough. Holes 64 help to reduce squeeze film damping and viscous damping effects. Cavity 62 and holes 64 may be processed as shown in FIGS. 1B through 1E.

Figure 1B:
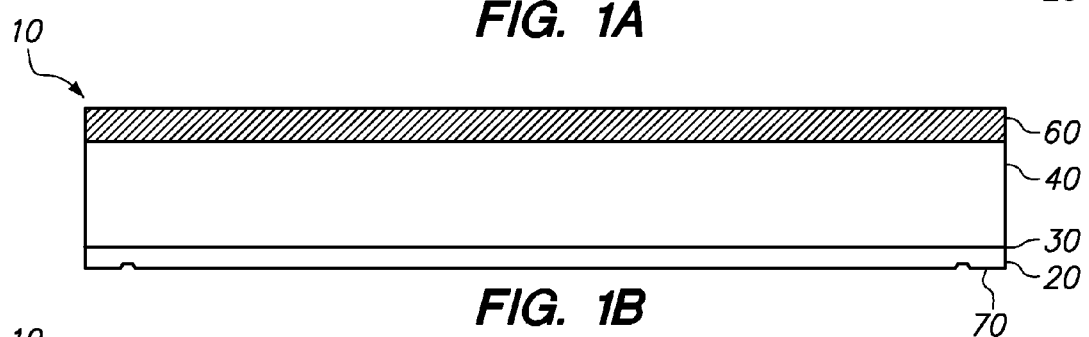
Figure 1C:
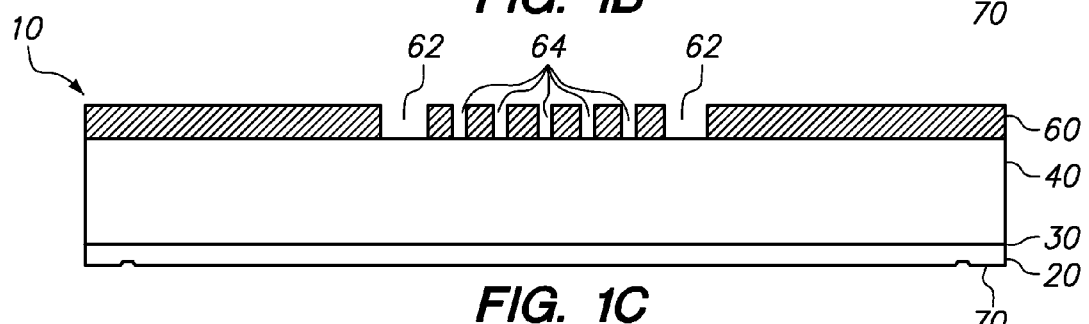
Figure 1D:
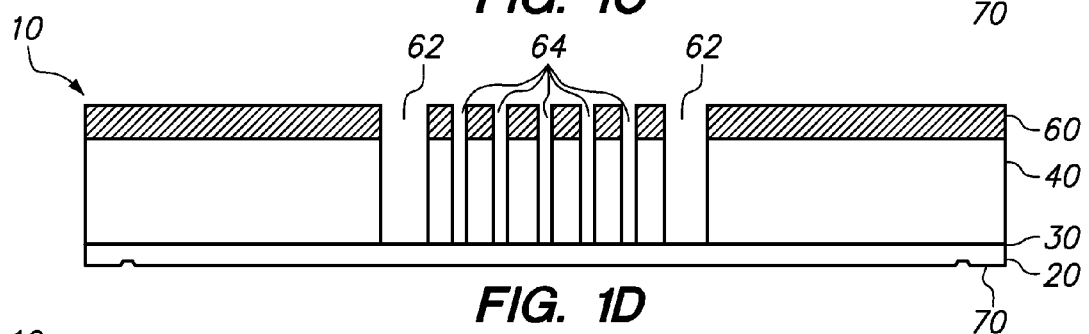
Figure 1E:
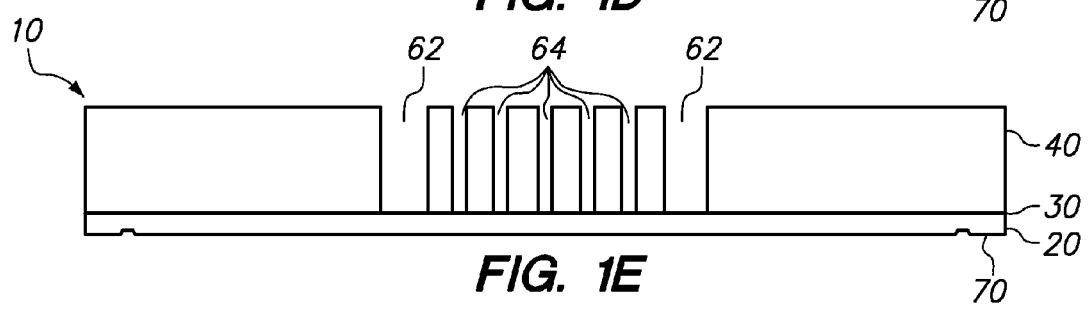

As shown in FIG. 1B, a layer of photoresist 60 is applied to wafer handle layer 40 to protect portions of wafer handle layer 40 during subsequent etching of cavity 62 and holes 64. The layer of photoresist 60 may be pattered as shown in FIG. 1C, with such pattern transferred to handle wafer 40 via an etch, such as a reactive ion etch or a deep reactive ion etch (DRIE). The etch proceeds all through handle wafer 40 and ends at BOX layer 30. It should be recognized that, if DRIE is used, DRIE does not have infinite selectivity to oxide and that the thickness of BOX layer 30 should be appropriately chosen so that the DRIE can correctly end on BOX layer 30 without also etching device layer 20. The result of the etch process may be similar to that shown in FIGS. 1D and 2. The result of the etch process may also produce a wafer handle layer configured similarly to that shown in FIGS. 3A and 3B. Next, the layer of photoresist 60 may be removed using standard resist strip techniques, such as a combination of wet/dry etching, resulting in a wafer as shown in FIG. 1E.

Figure 2:
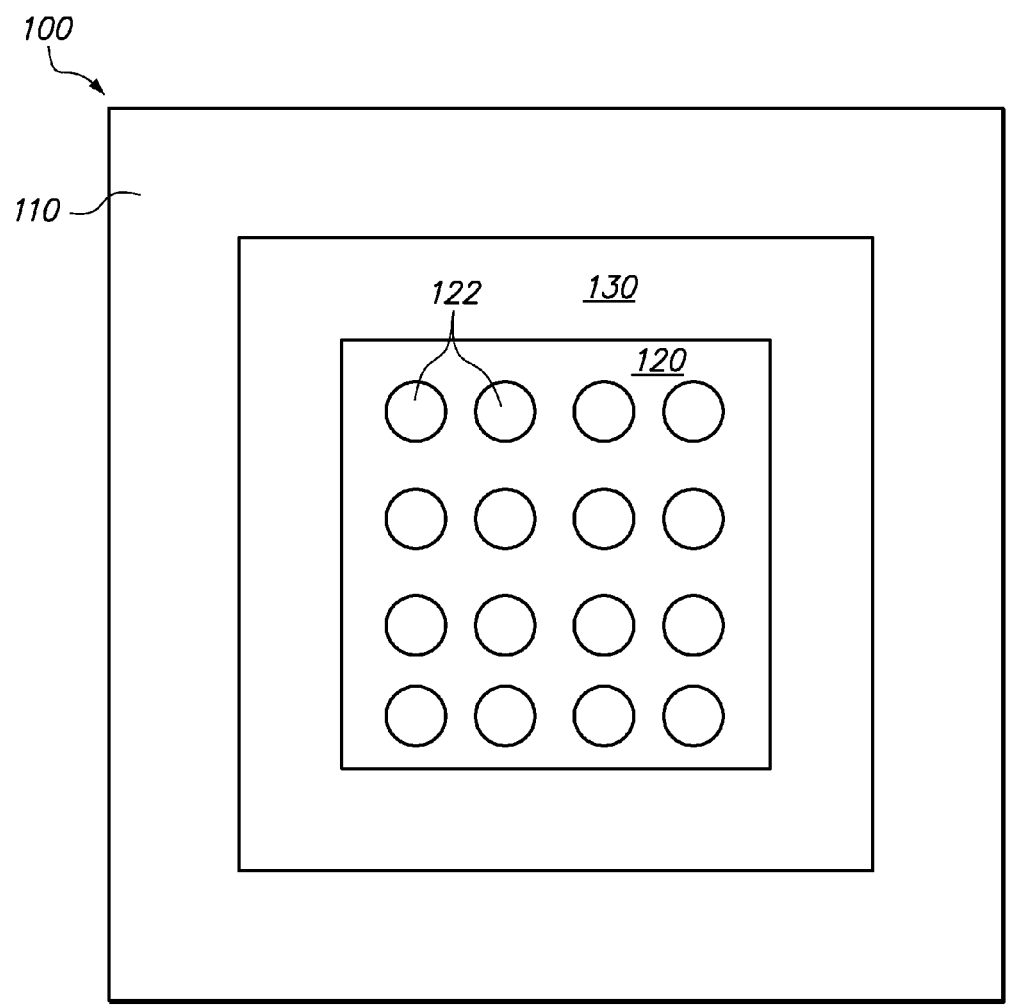
FIG. 2 shows a top view of an embodiment of a wafer handle layer having a cavity therethrough, in accordance with the Method for Fabricating a Dual-Crystalline Silicon Suspension System Using Pre-Fabricated Cavities.

FIG. 2 shows a top view of an embodiment of a wafer handle layer 100 having a cavity therethrough, in accordance with the Method for Fabricating a Dual-Crystalline Silicon Suspension System Using Pre-Fabricated Cavities. Wafer handle layer 100 may correspond to wafer handle layer 40 shown in FIG. 1. Wafer handle layer 100 includes a support structure 110 separated from a proof mass 120 by a single cavity 130. As shown, cavity 130 entirely defines proof mass 120. Proof mass 120 includes a plurality of viscous damping holes 122 therethrough, similar to holes 64 of wafer 10.

Figure 3A:
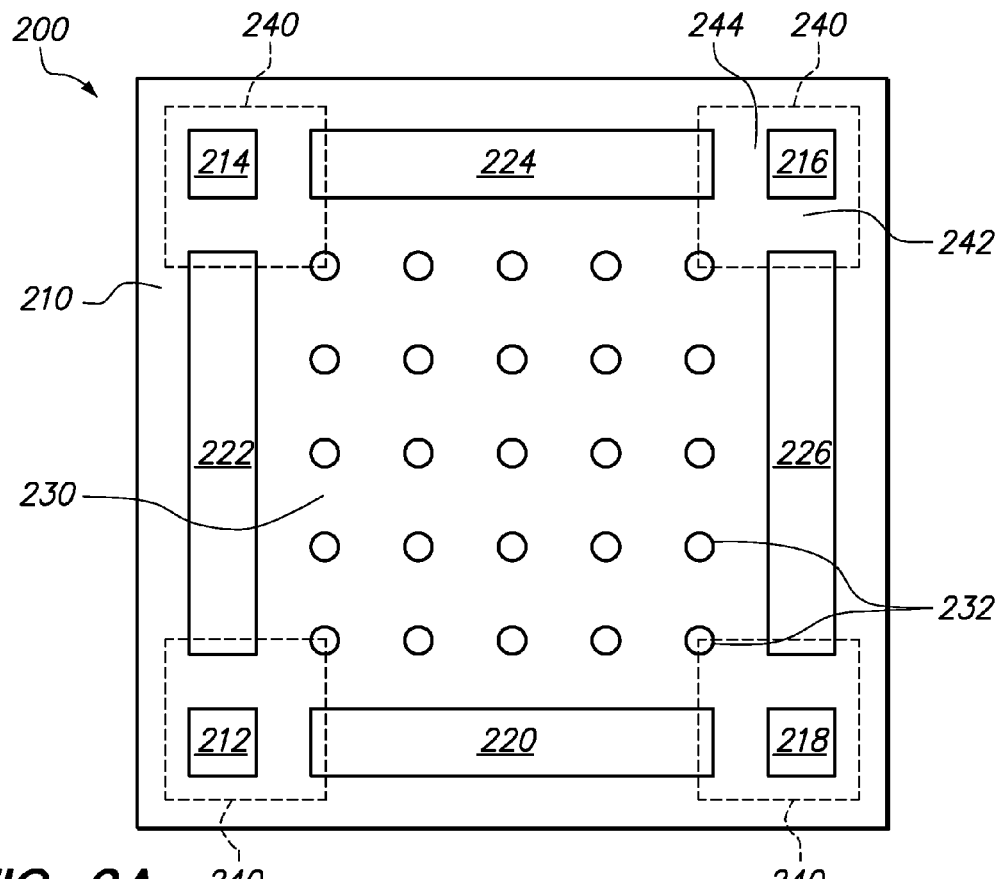
FIGS. 3A and 3B show, respectively, a top view and a top perspective view of an embodiment of a wafer handle layer having multiple cavities therethrough, in accordance with the Method for Fabricating a Dual-Crystalline Silicon Suspension System Using Pre-Fabricated Cavities.
Figure 3B:
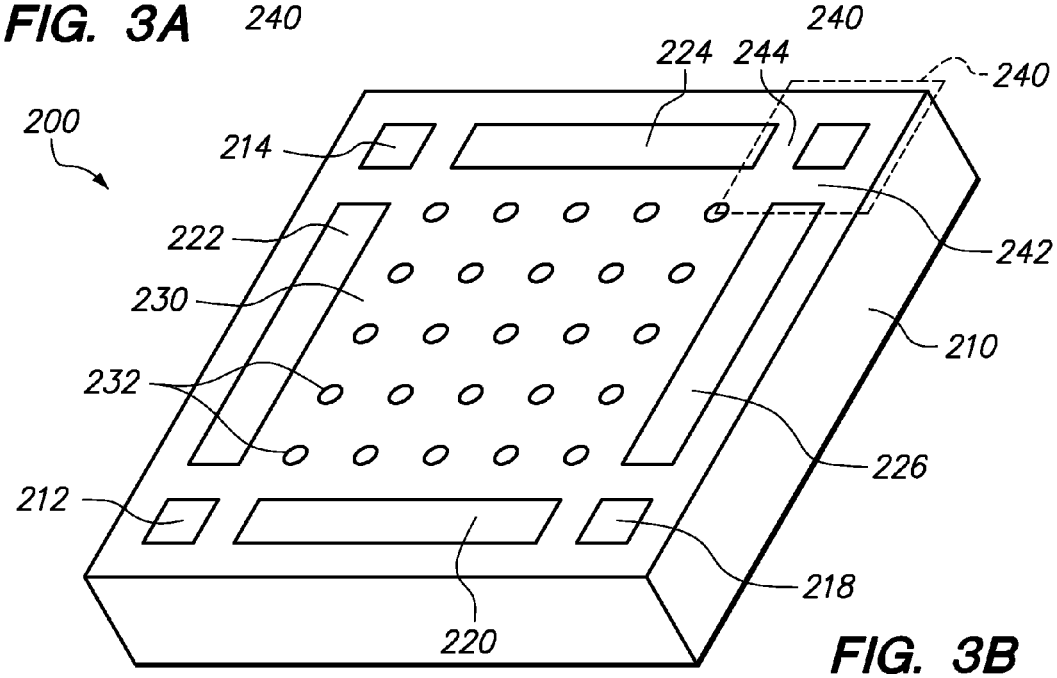

FIGS. 3A and 3B show, respectively, a top view and a top perspective view of an embodiment of a wafer handle layer 200 having multiple cavities therethrough, in accordance with the Method for Fabricating a Dual-Crystalline Silicon Suspension System Using Pre-Fabricated Cavities. Wafer handle layer 200 includes a support structure 210 separated from a proof mass 230 by multiple cavities 212, 214, 216, 218, 220, 222, 224, and 226. As shown, the cavities substantially define proof mass 230. Proof mass 230 includes a plurality of viscous damping holes 232 therethrough, similar to holes 64 of wafer 10 and holes 122 of wafer handle layer 100.

Wafer handle layer 200 further includes tethered regions 240. The tethered regions 240 comprise the regions where proof mass 230 is connected to support structure 210. Tethered regions 240 are formed within wafer handle layer 200. In embodiments where proof mass 230 is substantially square in shape, such as shown in FIGS. 3A and 3B, there are four tethered regions 240 that are located adjacent to the corners of proof mass 230. In other embodiments, there may be more or less tethered regions 240 depending upon the shape of proof mass 230 and the number of tethers. In some embodiments, tethered regions 240 comprise more than one tethers. As an example, tethered region 240 may include tethers 242 and 244. In some embodiments, tethered region 240 may only include one tether or may include more than two tethers.

Figure 4A:
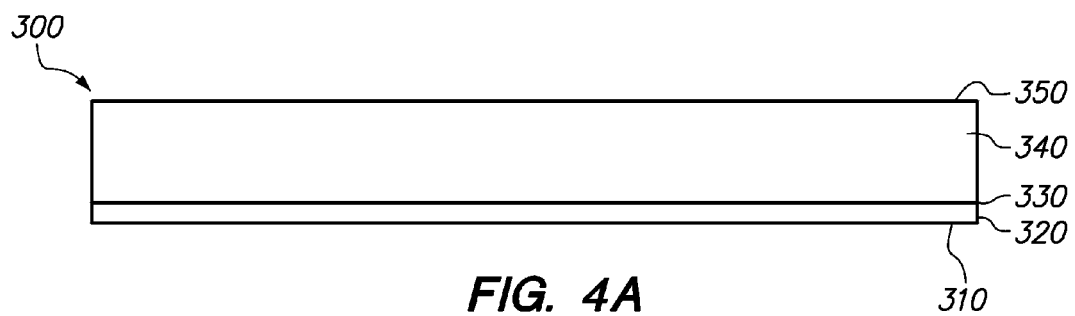
FIG. 4A shows a cross-section view of an embodiment of a second SOI wafer, in accordance with the Method for Fabricating a Dual-Crystalline Silicon Suspension System Using Pre-Fabricated Cavities.

FIG. 4A shows a cross-section view of an embodiment of a second SOI wafer 300, in accordance with the Method for Fabricating a Dual-Crystalline Silicon Suspension System Using Pre-Fabricated Cavities. Second SOI wafer 300 may include a second SOI wafer oxide layer 310 and a second SOI wafer device layer 320 coupled to second SOI wafer oxide layer 310. In some embodiments, second SOI wafer 300 includes a second SOI wafer BOX layer 330 coupled to second SOI wafer device layer 320 and a second SOI wafer handle layer 340 coupled to second SOI wafer BOX layer 330. Still in further embodiments, second SOI wafer handle layer 340 may have a second oxide layer 350 coupled thereto. Second oxide layer 350 may be thermally grown or deposited on second SOI wafer handle layer 340. Second SOI wafer device layer 320 may comprise mono-crystalline silicon.

In some embodiments, second SOI wafer 300 may be a bulk silicon wafer. In such embodiments, second SOI wafer 300 may be ground/polished to a desired thickness. In further embodiments, second SOI wafer 300 may include a thicker device layer 320 than intended, with the device layer then subsequently ground/polished to a desired thickness.

Figure 4B:
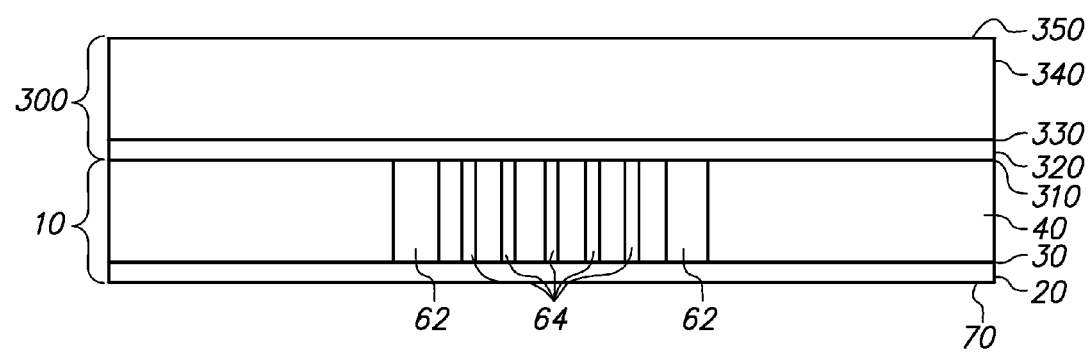
FIG. 4B shows a cross-section view of an embodiment of a second SOI wafer bonded to a first SOI wafer, in accordance with the Method for Fabricating a Dual-Crystalline Silicon Suspension System Using Pre-Fabricated Cavities.

FIG. 4B shows a cross-section view of an embodiment of second SOI wafer 300, as shown in FIG. 4A, bonded to first SOI wafer 10, as shown in FIG. 1E, in accordance with the Method for Fabricating a Dual-Crystalline Silicon Suspension System Using Pre-Fabricated Cavities. The bonding of wafer 300 onto wafer 10 encloses cavity 62 and holes 64. As an example, the bonding may be accomplished by a fusion bond. It may be advantageous to use a second SOI wafer that has been processed similarly to the first SOI wafer, rather than a bulk SOI wafer, as the second SOI wafer device layer thickness will be well-defined and the subsequent removal of the second SOI wafer's handle layer will be simpler. The use of a bulk SOI wafer entails a subsequent combination of grinding and CMP to define the exact spring thickness and to produce a polished surface. The mechanical grinding can impart stress on the entire structure and result in possibly lower yield as it may be harder to define an exact layer thickness during the grinding/CMP step. As such, the resulting system should have oxide layers 30 and 310 that are equal in thickness and also device layers 20 and 320 that are equal in thickness to balance stress throughout the system and reduce thermal effects.

Figure 4C:
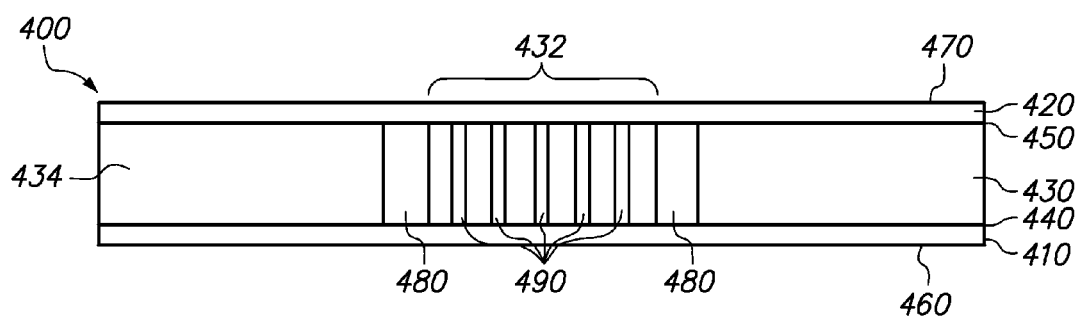
FIG. 4C shows a cross-section view of an embodiment of a second SOI wafer bonded to a first SOI wafer, with the second SOI wafer handle layer removed, in accordance with the Method for Fabricating a Dual-Crystalline Silicon Suspension System Using Pre-Fabricated Cavities.

FIG. 4C shows a cross-section view of an embodiment of a system 400 created from the bonding of second SOI wafer 300 to first SOI wafer 10, with the second SOI wafer handle layer 340 removed. In some embodiments, second SOI wafer handle layer 340 may be removed entirely by wet-etch methods, such as by a DRIE. In other embodiments, second SOI wafer handle layer 340 may first be partially removed by mechanical grinding, with the rest of handle layer 340 being removed by a DRIE process.

System 400 includes a first SOI wafer device layer 410, a second SOI wafer device layer 420, a first SOI wafer handle layer 430, a first SOI wafer BOX layer 440 and a second SOI wafer BOX layer 450. System 400 may further include a first SOI wafer oxide layer 460 as well as a second SOI wafer oxide layer 470. For example, oxide layers 460 and 470 may be thermally grown or deposited. As shown, first SOI wafer handle layer includes a cavity 480 extending therethrough. As used herein, the phrase "extending therethrough" means extending all the way through first SOI wafer handle layer 430 from first SOI wafer BOX layer 440 to second SOI wafer BOX layer 450. Cavity 480 separates a proof mass 432 from a support structure 434. Proof mass 432 includes viscous damping holes 490 therethrough.

The system shown in FIG. 4C may be handled, for subsequent processing, similar to any other bulk starting material wafer, which greatly simplifies the ability to handle and process wafers having deep cavities or trenches therein. As an example, system 400 may then proceed through standard semiconductor or micro-electrical mechanical system (MEMS) fabrication processes such as metal deposition and patterning, dielectric deposition and patterning, and implantation. System 400 may be used as a generalized platform for creating a multitude of high-quality MEMS sensors that contain single crystal silicon springs that may be attached to the top and bottom of a proof mass region, increasing stability and performance.

Figure 5A:
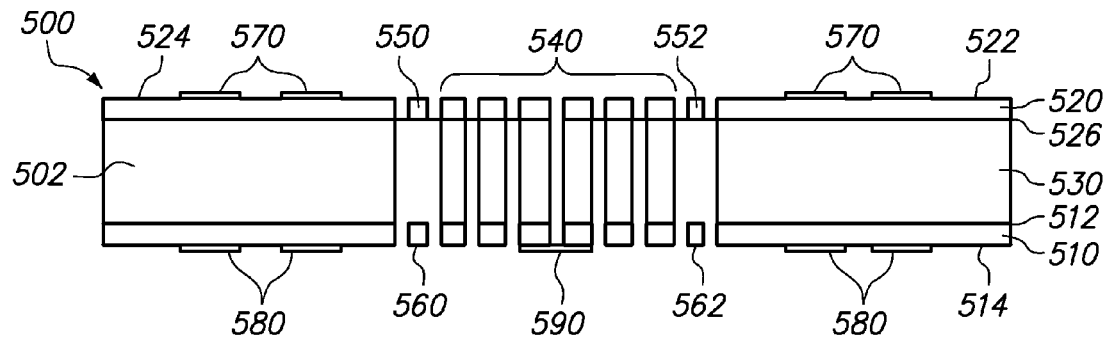
FIGS. 5A-5C show cross-section views of an embodiment of a dual-crystalline silicon suspension system processed in accordance with the Method for Fabricating a Dual-Crystalline Silicon Suspension System Using Pre-Fabricated Cavities.
Figure 5B:
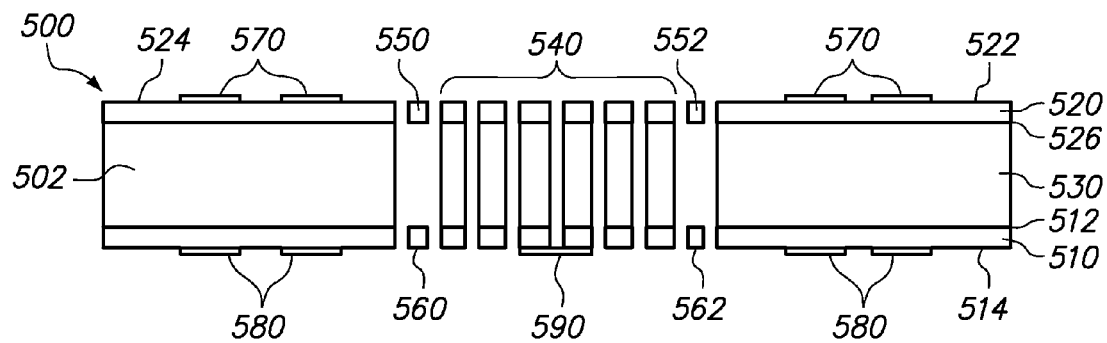
Figure 5C:
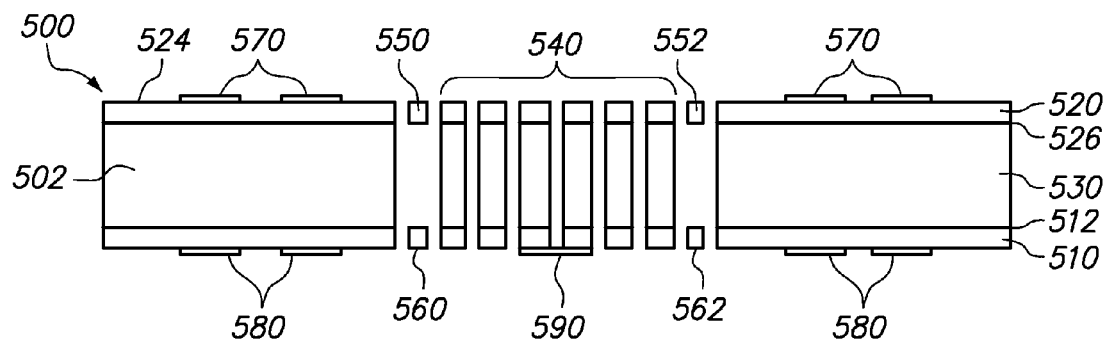

FIGS. 5A-5C show cross-section views of an embodiment of a dual-crystalline silicon suspension system 500 processed in accordance with the Method for Fabricating a Dual-Crystalline Silicon Suspension System Using Pre-Fabricated Cavities. System 500 includes a first SOI wafer device layer 510, a first SOI wafer BOX layer 512 coupled to first SOI wafer device layer 510, and a first SOI wafer handle layer 530 coupled to first SOI wafer BOX layer 512. First SOI wafer handle layer 530 includes at least one cavity extending therethrough that substantially defines a proof mass 540. In some embodiments, wafer handle layer 530 includes a single cavity (such as in FIG. 2) entirely defining proof mass 540. In other embodiments, wafer handle layer 530 includes multiple cavities (such as in FIGS. 3A and 3B), wherein the cavities are separated by tethered regions connecting proof mass 540 to a support structure 502. The tethered regions are formed within wafer handle layer 530.

System 500 includes an upper spring system comprising springs 550 and 552, as well as a lower spring system comprising springs 560 and 562. As an example, the spring systems may be configured similarly to those shown in FIGS. 6A and 6B. System 500 may further include top electrodes 570 coupled to second SOI wafer device layer 520 and bottom electrodes coupled to first SOI wafer device layer 510. Further, system 500 may include a device 590, such as a mirror, coupled to the bottom of proof mass 540. The formation of the spring systems typically does not occur until after any metals and dielectrics necessary for the intended sensor application have been deposited and etched, including any bond metallization. As such, in some embodiments, electrodes 570 and 580 may be formed prior to the etching of springs 550, 552, 560, and 562.

System 500 further includes a second SOI wafer bonded to the first SOI wafer. The second SOI wafer includes a second SOI wafer BOX layer 526 and a second SOI wafer device layer 520 coupled to second SOI wafer BOX layer 526. Second SOI wafer may further include a second SOI wafer oxide layer 522 coupled to second SOI wafer device layer 520.

FIGS. 5A-5C illustrate a self-aligned etch that may be used to remove parts of first SOI wafer device layer 512 and second SOI wafer device layer 526 that are adjacent to upper springs 550 and 552 and lower springs 560 and 562 of system 500. As an example of the process, prior to etching around upper springs 550 and 552, a layer of protective oxide 524 is coated on second SOI wafer second BOX layer 522 and around springs 550 and 552. As an example, the layer of oxide 524 may be a PECVD oxide with a thickness of 0.5 um. Then, an etch is performed to remove portions of second SOI wafer BOX layer 526 as shown in FIG. 5B. The portions to etch are located above the tethered regions to be removed, allowing unfettered access to the tethered regions.

Next, the tethered regions of wafer handle layer 530 may be removed by etching, such as by XeF2, SF6, or any wet selective etch chemistry. It should be noted that in order to fully remove the tethered regions, etching the tethered regions in both directions (upward and downward) may be needed. As such, a similar etching process should occur through first SOI wafer device layer 512 and upward through the tethered regions. Prior to any such etching however, an oxide layer would be applied to the lower spring system in a similar manner as to the upper spring system. Subsequent to the etching, oxide layer 524 is removed as shown in FIG. 5C.

Figure 6A:
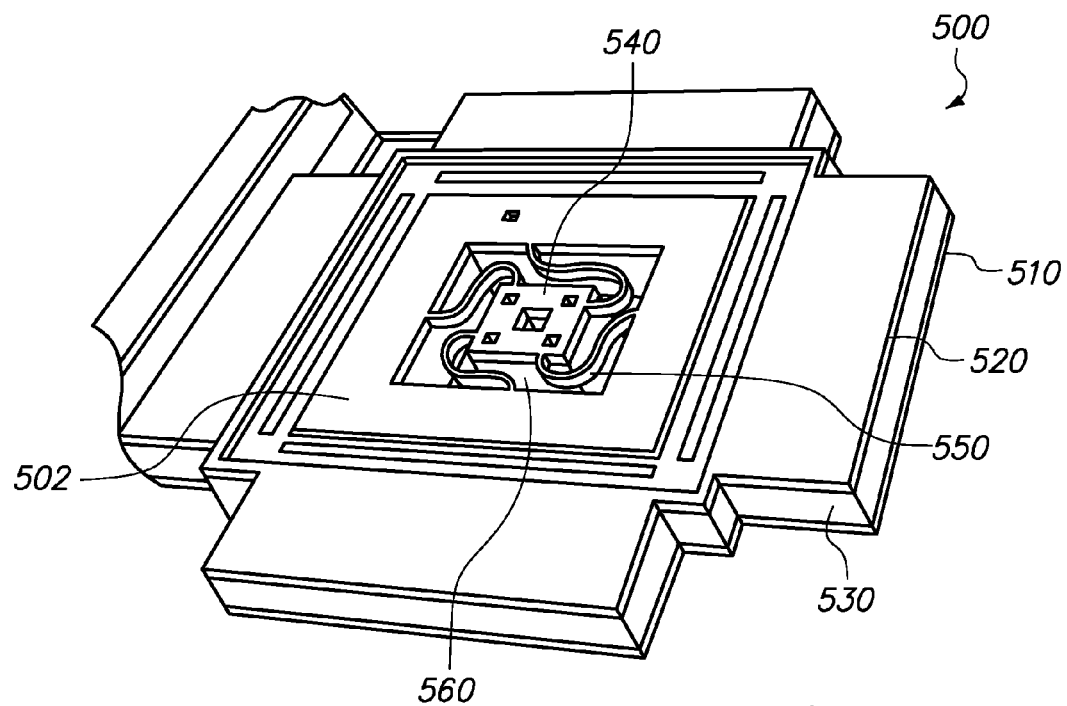
FIG. 6A shows a top perspective view of an embodiment of a dual-crystalline silicon suspension system, including a proof mass and support structure, processed in accordance with the Method for Fabricating a Dual-Crystalline Silicon Suspension System Using Pre-Fabricated Cavities.
Figure 6B:
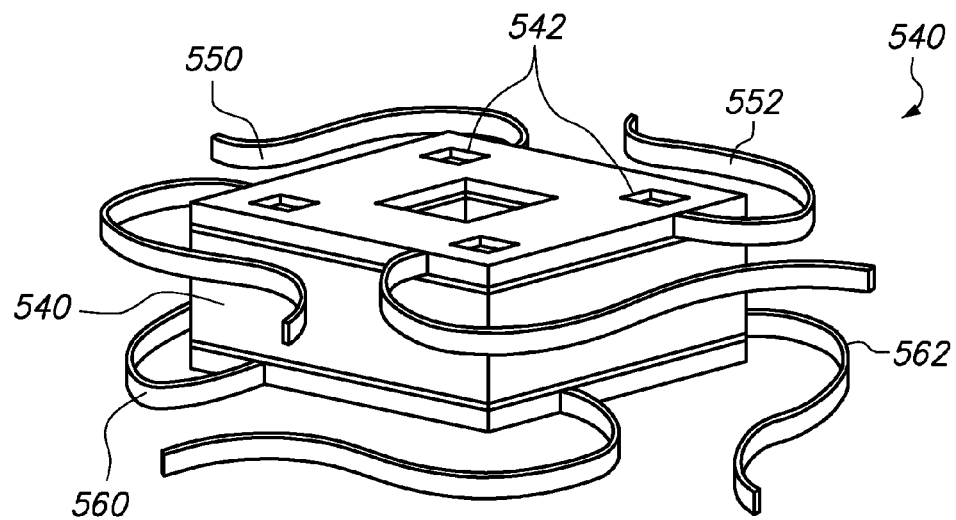
FIG. 6B shows a front perspective view of an embodiment of a proof mass and upper and lower spring systems, processed in accordance with the Method for Fabricating a Dual-Crystalline Silicon Suspension System Using Pre-Fabricated Cavities.

Referring to FIGS. 6A and 6B, FIG. 6A shows a top perspective view of an embodiment of a dual-crystalline silicon suspension system connected to a support structure and FIG. 6B shows a front perspective view of an embodiment of a proof mass 540 with upper and lower spring systems, processed in accordance with the Method for Fabricating a Dual-Crystalline Silicon Suspension System Using Pre-Fabricated Cavities. FIGS. 6A and 6B show a dual-crystalline silicon suspension system similar to that shown in FIGS. 5A-5C. As shown in FIGS. 6A and 6B, proof mass 540 is separated from a support structure 502 by a cavity 560. Proof mass 540 is connected to support structure 502 by an upper spring system comprising springs such as springs 550 and 552, and a lower spring system comprising springs such as springs 560 and 562.

Springs 550, 552, 560, and 562 extend from proof mass 540. Springs 550, 552, 560, and 562 may vary in shape. For example, springs 550, 552, 560, and 562 may be curved in shape, as shown. In other embodiments, springs 550, 552, 560, and 562 may be linear, angled, or any other design as recognized by one having ordinary skill in the art. Further, springs 550, 552, 560, and 562 may vary in orientation with respect to proof mass 540. As an example, springs 550 and 552 may be oriented on a different side of proof mass 540 than springs 560 and 562, as shown. In other embodiments, more than one spring may extend from one side of proof mass 540, or no springs may extend from a particular side of proof mass 540.

The orientation of springs 550, 552, 560, and 562 may depend upon the shape of proof mass 540. For example, in an embodiment wherein proof mass 540 is circular or otherwise curved in shape, springs 550, 552, 560, and 562 may be placed at various spaced intervals along the perimeter of proof mass 540. The design of the upper spring system and lower spring system may be any arbitrary pattern definable through photolithographic steps and etching, for example Deep Reactive Ion Etching (DRIE). The suspension system can be designed such that the upper spring system and the lower spring system are symmetric, 180 degrees out of phase with one another, or two different geometries altogether.

Figure 7:
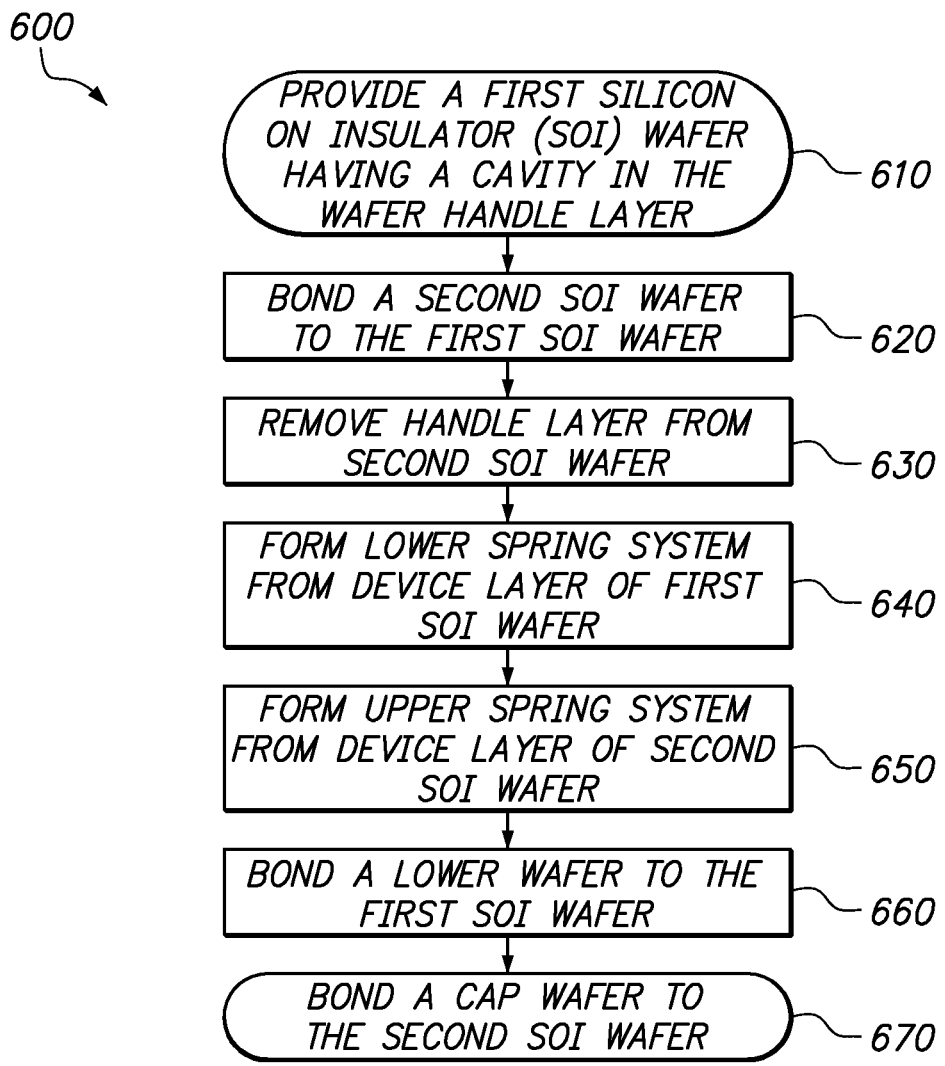
FIGS. 7 and 8 show flowcharts of embodiments of methods in accordance with the Method for Fabricating a Dual-Crystalline Silicon Suspension System Using Pre-Fabricated Cavities.
Figure 8:
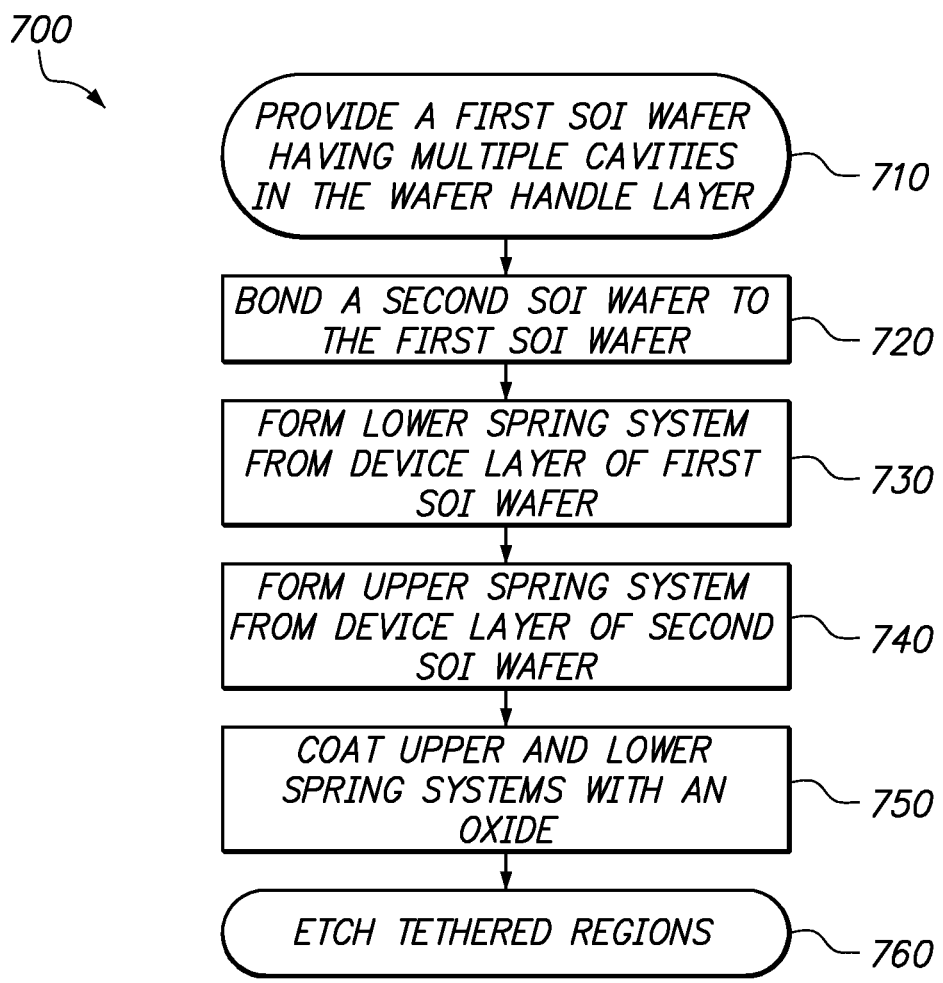

FIGS. 7 and 8 show flowcharts of embodiments of methods in accordance with the Method for Fabricating a Dual-Crystalline Silicon Suspension System Using Pre-Fabricated Cavities. The methods shown in FIGS. 7 and 8 will be discussed with reference to the wafers and systems shown in FIGS. 1-6. Referring to FIG. 7, method 600 begins at step 610, wherein a first SOI wafer is provided. In some embodiments, the first SOI wafer is configured similarly as first SOI wafer 10 of FIG. 1. Step 620 then involves bonding a second SOI wafer to the first SOI wafer. The second SOI wafer may be configured similarly to second SOI wafer 300 of FIG. 4. As an example, the second SOI wafer may be fusion bonded to the first SOI wafer. The result of step 620 may be the system shown in FIG. 4B. Step 630 then involves removing the handle layer 340 from the second SOI wafer 300. As an example, the result of step 630 may be the system shown in FIG. 4C.

Step 640 may then involve forming a lower spring system (springs 560 and 562 of FIG. 5) from device layer 510 of the first SOI wafer. As an example, step 640 may involve etching more than one portions of the first SOI wafer device layer 510 proximate to the cavity(ies) within first SOI wafer handle layer 530. In the example shown in FIGS. 5A-5C, the term "proximate to" refers to the area of device layer 510 below the cavities and BOX layer 512. Step 650 may then involve forming an upper spring system (springs 550 and 552 of FIG. 5A) from device layer 520 of the second SOI wafer. For example, step 650 may involve etching more than one portions of the second SOI wafer device layer 520 proximate to the cavity(ies) within first SOI wafer handle layer 530. In the example shown in FIG. 5A-5C, the term "proximate to" refers to the area of device layer 520 above the cavities and BOX layer 526. Method 600 may then proceed to step 660, where a lower wafer is bonded to the first SOI wafer, and to step 670, where a cap wafer is bonded to the second SOI wafer.

Referring to FIG. 8, method 700 may begin at step 710, where a first SOI wafer is provided having multiple cavities in the wafer handle layer that substantially define a proof mass. The multiple cavities may also form tethered regions that connect the proof mass to a support structure. The first SOI wafer may be similar to first SOI wafer 10 having a wafer handle layer that is configured similarly to wafer handle layer 200 shown in FIGS. 3A and 3B. Step 720 involves bonding a second SOI wafer to the first SOI wafer. The second SOI wafer may be configured similarly to second SOI wafer 300 of FIG. 4A. Step 730 involves forming a lower spring system from the device layer of the first SOI wafer, while step 740 involves forming an upper spring system from the device layer of the second SOI wafer. As an example, the upper and lower spring system may be configured similarly to the spring systems shown in FIGS. 6A and 6B. Step 750 may then involve coating the upper and lower spring systems with an oxide, in preparation for subsequent etching.

Next, method 700 may proceed to step 760, which involves etching the tethered regions. Etching the tethered regions may first involve removing the exposed portions of the BOX layers that are contiguous with the cavities. As an example, step 760 may involve removing the portions of BOX layer 526 as shown in FIGS. 5A and 5B. Removal of such portions allows unfettered access to the tethered regions located within first SOI wafer handle layer 530. Next, the tethered regions may be etched. As an example, the tethered regions may be etched using a Xenon di-flouride etch, a Sulfur Hexaflouride (SF6) etch, or a wet selective etch chemistry such as Potassium Hydroxide (KOH) or Tetra-methyl-ammonium hydroxide (TMAH). Once the tethers have been removed, the proof mass is free to move and can be bonded to a lower wafer and/or a cap wafer.

The disclosed methods result in a dual crystalline silicon suspension system having a top and bottom surface which is solid and free from topography, allowing it to be treated like any other ordinary starting wafer material, except that is has within it protected cavities. The thickness of the compliant regions can be well defined and polished to a smooth surface. Additionally, because the compliant regions and the proof mass can both be made out of the same single crystalline silicon, the stress contained within the compliant regions can be minimized. This disclosure also solves the general problem of processing wafers that contain deep etch geometries. These types of devices that contain large topographies can cause vacuum leaks in processing equipment making their subsequent processing difficult if not impossible. Large exposed topographies can also lead to other processing issues such as the inability to remove photoresist out of the holes or other deposited materials. The methods disclosed herein mitigate this problem by encapsulating the deep trenches and topography such that the external surfaces are flat and smooth with no voids.

Further, the methods disclosed herein allow for very small gaps to be created in the device layer silicon. As an example, such techniques may be used to produce the small gaps that exist between the teeth of a comb tooth drive, such small distances being required to reduce the applied voltage necessary to impart force. Generally, due to limitations with DRIE sidewall etch ratio, the small gaps defined by a comb tooth structure cannot be transferred through the entire handle wafer. By forming open cavities underneath the area containing fine features, those features only need to be patterned into the device layer silicon, which may be substantially less thick than the handle wafer. Thus, the DRIE sidewall etch ratio is not a limiting factor in the creation of fine features.

Many modifications and variations of the Method for Fabricating a Dual-Crystalline Silicon Suspension System Using Pre-Fabricated Cavities are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

We claim:

1. A method comprising the steps of:
   providing a first silicon-on-insulator (SOI) wafer comprising
   a first SOI wafer device layer,
   a first SOI wafer buried oxide (BOX) layer directly coupled to the first SOI wafer device layer, and a first SOI wafer handle layer directly coupled to the first SOI wafer BOX layer, wherein the first SOI wafer handle layer has multiple cavities extending therethrough that substantially define a proof mass, wherein the multiple cavities are separated by tethered regions connecting the proof mass to a support structure, the tethered regions formed within the first SOI wafer handle layer;
   bonding a second SOI wafer to the first SOI wafer, the second SOI wafer comprising
   a second SOI wafer oxide layer, and a second SOI wafer device layer directly coupled to the second SOI wafer oxide layer, wherein the second SOI wafer is bonded to the first SOI wafer such that the second SOI wafer oxide layer is directly coupled to the first SOI wafer handle layer;
   forming an upper spring system by etching more than one portions of the second SOI wafer device layer proximate to the multiple cavities; and
   forming a lower spring system by etching more than one portions of the first SOI wafer device layer proximate to the multiple cavities.

2. The method of claim 1, wherein the tethered regions are located adjacent to corners of the proof mass and each of the tethered regions comprise more than one tether.

3. The method of claim 1, wherein the upper spring system and the lower spring system each comprise a plurality of springs extending from the proof mass.

4. The method of claim 1 further comprising the step of removing the tethered regions.

5. The method of claim 4, wherein the step of removing the tethered regions comprises the steps of:
coating each surface of both the upper spring system and the lower spring system with an oxide;
removing exposed portions of the first SOI wafer BOX layer and the second SOI wafer oxide layer that are contiguous with the multiple cavities; and
etching the tethered regions.

6. The method of claim 5 further comprising the steps of:
bonding a lower wafer to the first SOI wafer; and
bonding a cap wafer to the second SOI wafer.

7. The method of claim 1, wherein the second SOI wafer further comprises:
a second SOI wafer BOX layer coupled to the second SOI wafer device layer; and
a second SOI wafer handle layer coupled to the second SOI wafer BOX layer.

8. The method of claim 7 further comprising the step of removing at least a portion of the second SOI wafer handle layer.

9. The method of claim 1, wherein the second SOI wafer oxide layer is fusion bonded to the first SOI wafer handle layer.

10. The method of claim 1, wherein the first SOI wafer device layer and the second SOI wafer device layer comprise mono-crystalline silicon.

11. A method comprising the steps of:
providing a first silicon-on-insulator (SOI) wafer, the first SOI wafer comprising
a first SOI wafer device layer, a first SOI wafer buried oxide (BOX) layer coupled to the first SOI wafer device layer, and a first SOI wafer handle layer coupled to the first SOI wafer BOX layer, wherein the first SOI wafer handle layer has multiple cavities extending therethrough that substantially define a proof mass, wherein the cavities are separated by tethered regions connecting the proof mass to a support structure, the tethered regions formed within the first SOI wafer handle layer;
bonding a second SOI wafer to the first SOI wafer, the second SOI wafer comprising
a second SOI wafer oxide layer, a second SOI wafer device layer coupled to the second SOI wafer oxide layer, a second SOI wafer BOX layer coupled to the second SOI wafer device layer, and a second SOI wafer handle layer coupled to the second SOI wafer BOX layer, wherein the second SOI wafer oxide layer is bonded to the first SOI wafer handle layer;
removing at least a portion of the second SOI wafer handle layer;
forming an upper spring system by etching more than one portions of the second SOI wafer device layer proximate to the multiple cavities;
forming a lower spring system by etching more than one portions of the first SOI wafer device layer proximate to the more than one cavities; and
removing the tethered regions.

12. The method of claim 11, wherein the step of removing the tethered regions comprises the steps of:
coating each surface of both the upper spring system and the lower spring system with an oxide;
removing exposed portions of the first SOI wafer BOX layer and the second SOI wafer oxide layer that are contiguous with the multiple cavities; and
etching the tethered regions.

13. The method of claim 11 further comprising the steps of:
bonding a lower wafer to the first SOI wafer; and
bonding a cap wafer to the second SOI wafer.

* * * * *